(12) United States Patent
Simmons et al.

(10) Patent No.: US 6,876,218 B1
(45) Date of Patent: Apr. 5, 2005

(54) METHOD FOR ACCURATE OUTPUT VOLTAGE TESTING

(75) Inventors: Tuyet Ngoc Simmons, Los Gatos, CA (US); Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 50 days.

(21) Appl. No.: 10/367,385

(22) Filed: Feb. 14, 2003

(51) Int. Cl.[7] .............................................. G01R 31/28
(52) U.S. Cl. ...................................... 324/763; 324/765
(58) Field of Search .............................. 324/158.1, 763, 324/765, 73.1; 327/597, 62–67; 714/724, 733; 438/14–18

(56) References Cited

U.S. PATENT DOCUMENTS 5,436,558 A * 7/1995 Saitoh et al. ............ 324/158.1
5,578,935 A * 11/1996 Burns ......................... 324/763
5,617,037 A * 4/1997 Matsumoto ................. 324/763
5,942,921 A * 8/1999 Talaga, Jr. .................... 327/77

* cited by examiner

*Primary Examiner*—Vinh P. Nguyen
(74) *Attorney, Agent, or Firm*—Justin Liu

(57) ABSTRACT

A method for accurate testing of the output voltage of an integrated circuit comprises enabling a differential voltage comparator on the integrated circuit to be tested. One input to the differential comparator is set to a reference voltage, and the other input is coupled to a node to be tested. A current load is injected at the node, and the output of the voltage comparator can be used to determine if the integrated circuit performs within the specifications set by a manufacturer.

21 Claims, 4 Drawing Sheets

METHOD FOR ACCURATE OUTPUT VOLTAGE TESTING

FIELD OF THE INVENTION

The invention relates to the testing of integrated circuits, and, more particularly, to the testing of output voltage of an integrated circuit.

BACKGROUND OF THE INVENTION

After an integrated circuit (IC) has been fabricated, it must be carefully tested to ensure that it meets the performance standards and specifications set by the manufacturer. Typically, an IC must perform its intended function correctly, and must perform within the parameters set forth on the manufacturer's data sheet for that IC. ICs that fail to perform as intended, or that fail to meet data sheet specifications are rejected and discarded.

An ideal test program would reject and discard only those ICs that failed to perform as intended (each "bad die"), and would permit every IC that performs within the manufacturer's specification (each "good die") to pass. Unfortunately, limitations in test equipment and testing procedures can cause a manufacturer to reject and discard ICs that actually fall within acceptable performance standards, and accept ICs that should be rejected. Testing with the accuracy and precision necessary to reject every bad die and identify every good die may be impossible, too costly, or not feasible for other reasons. However, since there is a high cost associated with fabricating ICs, it is preferable not to reject or discard good dice. The challenge for manufacturers is to find cost-effective testing procedures.

Data sheets commonly specify output voltage levels, which are often governed by requirements of the input/output (I/O) standards an IC conforms to. One example of such a specification is $V_{DL}$, which is the maximum voltage level that is acceptable as a logic low value, and which is usually stated with respect to a given current load or logic standard. Similarly, $V_{OH}$ is the minimum voltage level acceptable as a logic high. An IC adhering to many different logic and I/O standards can have many different specifications for $V_{OL}$ and $V_{OH}$.

Prior art techniques for measuring $V_{OL}$ and $V_{OH}$ have been limited by the precision of the test equipment and by the parasitic effects of the connections between the IC and the test equipment. For example, a data sheet can specify $V_{OL}$ to be 400 mV (0.4 V) at a current of 24 mA. Normally, an IC being tested (also called a device under test, or "DUT") is coupled to an ATE (automated test equipment) through various wires and traces. The ATE will inject the current (24 mA) into the DUT and probe the resulting voltage level. If the resulting voltage is below 400 mV, the IC is a good die. One problem is that the wires and traces coupling the ATE to the DUT can introduce significant parasitic resistance. If, for instance, the connection between the ATE and the DUT has a resistance of 2 Ω, the voltage drop through the connection at 24 mA is 48 mV, representing more than 10% of the total measurement. This means that an IC can have an actual $V_{OL}$ of 360 mV (well within spec), but the ATE can read a voltage of 408 mV (due to the resistance of the connection) and reject the part. This problem is exacerbated by logic standards that specify even higher current loads, such as 48 mA and beyond. Other factors such as noise can lead to even greater errors in the measurement. In these cases, the manufacturer can end up rejecting and discarding many good dice, thereby driving up the cost of manufacturing the IC.

Therefore, a need exists for precise and cost-effective testing of the output voltage characteristics of an IC.

SUMMARY OF THE INVENTION

In accordance with the present invention, a method for testing an integrated circuit comprises enabling a differential comparator located on the IC and supplying a reference voltage to one input of the comparator. Test conditions, such as a current load, are established and the resulting voltage at the node under test is coupled to the other input of the comparator. The output of the comparator indicates whether the IC has passed the test.

A test configuration in accordance with the present invention includes a differential comparator located on an integrated circuit to be tested, a current source for providing a current load, and a reference voltage supply. One input of the comparator is coupled to the reference voltage, the other input is coupled to the node being tested, and the current load is injected at that node. In one embodiment, the differential comparator is a differential input buffer of the IC. The test configuration can also include some supporting logic, and, in one embodiment, the IC is a programmable logic device (PLD) and the supporting logic is programmed into the PLD.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of configurations for testing an integrated circuit (IC). The present invention has been found to be particularly applicable and beneficial for measuring certain data sheet voltage parameters. While the present invention is not so limited, an appreciation of the present invention is presented by way of specific examples, including an example for testing and measuring $V_{OL}$ of a programmable logic device. In the following description, numerous specific details are set forth in connection with the examples to provide a more thorough understanding of the present invention. However, it will be apparent to one ordinarily skilled in the art that the present invention can be practiced without these specific details.

Figure 1:
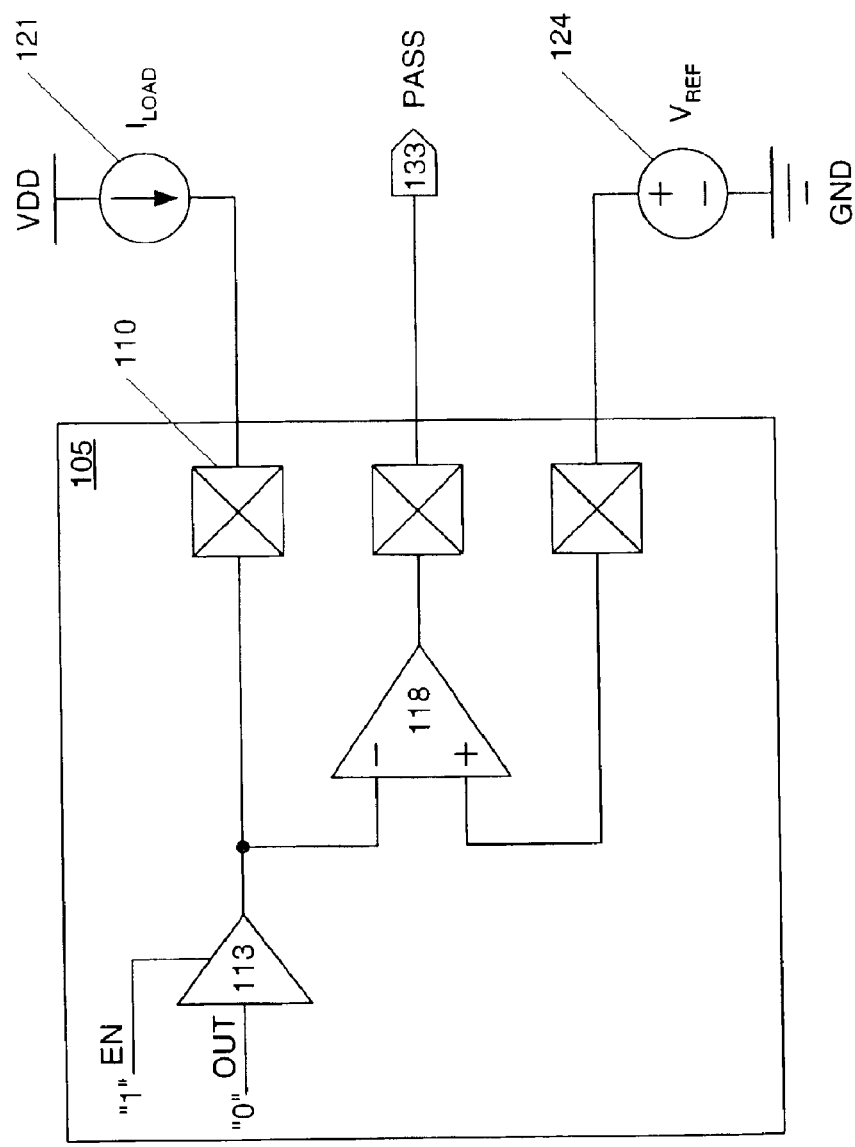
FIG. 1 shows a test configuration for testing $V_{OL}$ of an output buffer of an IC.

FIG. 1 shows a test configuration in accordance with the present invention. An IC 105 includes a differential comparator 118 and a tri-state output buffer 113 connected to an I/O pad 110. In this configuration, the $V_{OL}$ parameter for output buffer 113 at I/O pad 110 is being measured. $V_{OL}$ specifies the maximum voltage permitted at I/O pad 110 when output buffer 113 is driving a logic low at a given maximum current load. For example, the data sheet for an output of an IC can specify $V_{OL}$=400 mV at a current load of 24 mA. This means that for a good die, the output voltage of an output buffer driving a logic low will be 400 mV or lower when sinking a current of up to 24 mA. Note that $V_{OL}$ is typically specified at the package pin of a packaged IC, and not at the bonding pad (or similar structure) on the IC itself. In order to account for the small difference in voltage between the bonding pad and the package pin, a manufacturer can test to ensure that the output voltage of the output buffer on the IC die is at a specified voltage level less than the data sheet $V_{OL}$ (for example 320 mV). In such a situation, the present invention can be practiced by applying a reference voltage equal to the threshold voltage being tested for.

In the test configuration of FIG. 1, a current source 121 injects a current of $I_{LOAD}$ at I/O pad 110 representing the maximum current load. In one embodiment, current source 121 is part of test equipment that is external to the IC. In another embodiment, current can be injected by a current source located on the IC itself. Tri-state output buffer 113 has two inputs EN and OUT. EN is the enable signal for buffer 113 and OUT is the data signal. In a test configuration for measuring $V_{OL}$, the enable input EN is asserted and a logic low (or a "0") is the data signal OUT. This causes buffer 113 to drive a logic low at its output terminal, which is coupled to I/O pad 110 and current load 121.

One input of differential comparator 118, marked as the "−" input on FIG. 1, is also coupled to I/O pad 110. The other input of comparator 118, marked "+", is coupled to a reference voltage source 124 that provides a constant voltage level of $V_{REF}$. As with current source 121, voltage source 124 can be located in external equipment or on the IC. Comparator 118 compares the voltage levels received at its inputs, and the output of comparator 118 is coupled to node 133, corresponding to a PASS signal that indicates whether the IC has passed or failed the test. For instance, if the voltage at the "+" input to comparator 118 is greater than the voltage at the "−" input, comparator 118 produces a logic high at its output (indicating the test was passed). If the voltage at the "+" input is less than the voltage at the "−" input, the output of comparator 118 is a logic low (indicating the test was failed).

Figure 2:
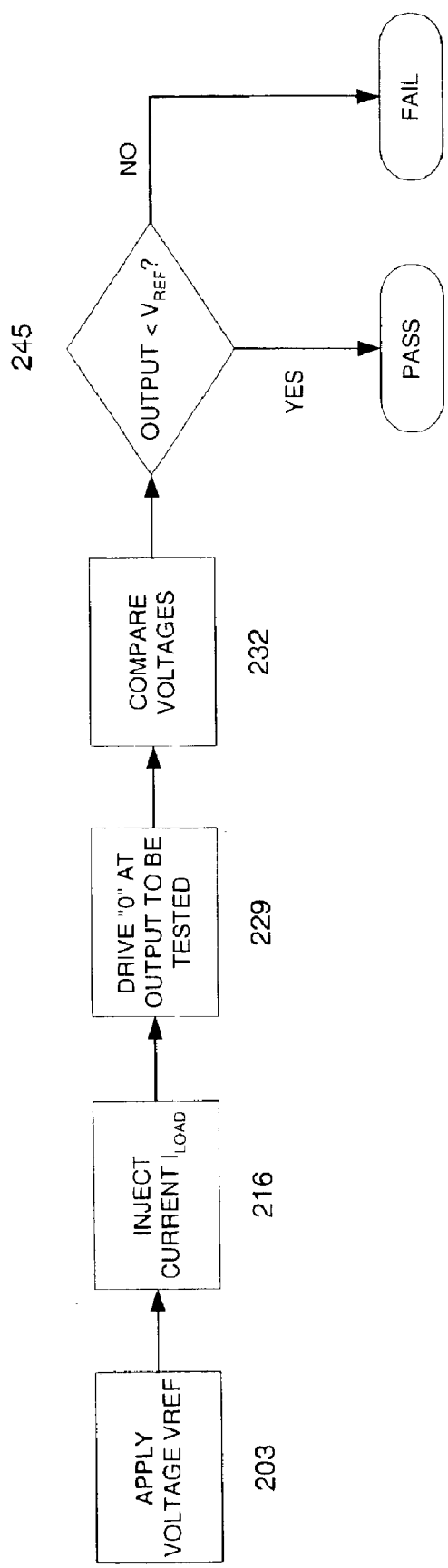
FIG. 2 is a flow diagram for a method of testing $V_{OL}$ of an IC.

With reference to the flow diagram of FIG. 2, in order to test an IC that has a specified $V_{OL}$ of 400 mV at a current load of 24 mA, voltage source 124 is set to 400 mV (step 203) and current source 121 is set to 24 mA (step 216). Output buffer 113 drives a logic low (step 229), and comparator 118 then compares the resulting voltage at pad 110 with the reference voltage of 400 mV (step 232). If the voltage at pad 110 is less than 400 mV, the output of comparator 118 will be a logic high, indicating that the I/O pad under test meets the data sheet specification (the YES branch of decision step 245). If the voltage at pad 110 is greater than the reference 400 mV, comparator 118 outputs a logic low, indicating a bad die (the NO branch of decision step 245).

In this test configuration, placing comparator 118 directly on the IC being tested allows for a very precise voltage measurement. In prior art testing methods, the parasitic effects of the connection between the IC under test and the voltage comparator in the ATE (automated test equipment) introduces significant error in the measurement. In the present invention, since comparator 118 is on the IC, those parasitic effects are eliminated, and the resulting more precise measurement allows a manufacturer to reject fewer good dice and increase the overall yield. A higher yield rate means lower costs for the manufacturer since less processed silicon is wasted.

A programmable logic device (PLD) is a type of integrated circuit well known to those of ordinary skill in the art that can be programmed or configured to perform specified logic functions. The field programmable gate array (FPGA) and the complex programmable logic device (CPLD) are examples of PLDs. A PLD can have various programmable resources, including, typically, programmable logic and I/O blocks (IOBs). The functionality of a PLD is typically controlled and determined by data bits provided to it for that purpose. For reasons detailed below, PLDs are especially well suited to testing methods in accordance with the present invention.

In one embodiment, comparator 118 can be a differential amplifier input of the IC. Differential amplifier inputs are used with certain I/O standards, such as HSTL (High Speed Transceiver Logic), which can have benefits such as voltage scalability, lower power, and increased speed. HSTL, for example, is a single-ended signaling standard that requires a differential amplifier at the receiver, with one leg of the differential amplifier connected to a reference voltage that defines the trip point. An IC that adheres to HSTL, or any similar standard, already has a differential input buffer that can be used during testing to measure output voltage characteristics. This means the present invention can be implemented with little or no additional circuitry.

The Virtex™ series of FPGAs, available from Xilinx®, Inc. of San Jose, Calif., for example, has differential amplifier inputs that, when appropriately configured, can be used during testing. An IOB of a Virtex FPGA can be configured with an output buffer conforming to the I/O standard for which $V_{OL}$ is to be tested, and with an differential amplifier input buffer conforming to the HSTL standard. The reference voltage for the HSTL input buffer is set to the $V_{OL}$ voltage, and a current load is injected at the IOB to be tested. The differential amplifier compares the resulting voltage at the IOB to the reference voltage ($V_{OL}$) and the output of the differential amplifier indicates the result of the test.

Figure 3:
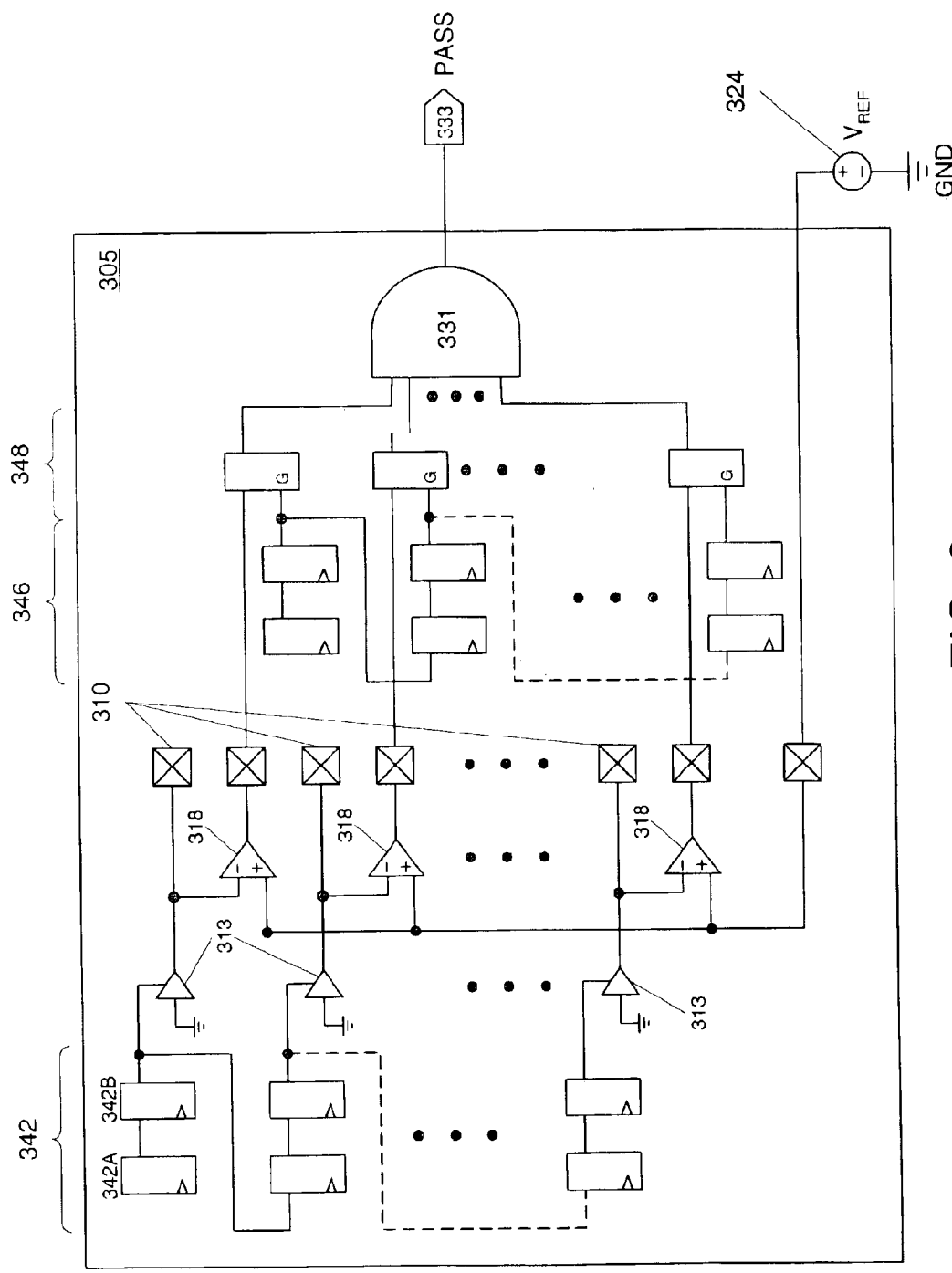
FIG. 3 shows a test configuration for testing $V_{OL}$ for several output buffers of an IC.

FIG. 3 shows another embodiment of the present invention for testing more than one I/O pad of IC 305. Each of a plurality of I/O pads to be tested 310 is coupled to the output of a tri-state buffer 313 and one input of a differential comparator 318. The other input of each comparator 318 is coupled to a reference voltage source 324 at a voltage of $V_{REF}$. As before, voltage source 324, while shown as an external voltage source, can also be incorporated as part of IC 305. Multiple voltage sources, either external or on-chip, similar to voltage source 324 can be used in accordance with the present invention, if needed.

IC 305 also includes some additional logic for controlling the testing of multiple I/O pads. As shown in the embodiment of FIG. 3, the logic can comprise shift registers 342 and 346, latches 348, and AND gate 331. Shift registers 342 can be used to step through each I/O pad to be tested, and assert the enable input of each tri-state buffer 313 in turn. In one embodiment, all of the registers of shift register 342 are initialized to 0 by, for example, asserting a reset input or providing a 0 from other control logic. Then, a 1 is shifted through register 342, for example by asserting a set input of one of the registers or by providing a 1 from other logic, to enable each output buffer in sequence. Two registers, for example registers 342A and 342B, can be used for each I/O to avoid the effects of simultaneous switching (such as noise). A current source (not shown, but equivalent to $I_{LOAD}$ 121 shown in FIG. 1) drives each I/O pad 310, and the resulting voltage at each I/O pad 310 is compared to reference voltage source 324 by comparator 318. The output of each comparator 318 indicates whether the I/O pad has passed the test.

A second shift register 346, similar to shift register 342, can be used to enable latches 348 for storing the test result from each comparator 318 in turn. Shift register 346 drives the enable inputs G of latches 348 in turn, and, similarly to shift register 342, two registers can be used at each stage to eliminate effects of simultaneous switching. After I/O pads 310 are tested, the results stored in latches 348 are AND'ed together by AND gate 331. If all of the I/O pads pass, then the output of AND gate 331 is a logic high, meaning IC 305 has passed the $V_{OL}$ test. If any one of the I/O pads has failed, then the output of gate 331 is a logic low, indicating IC 305 is a bad die. Those of ordinary skill in the art will readily appreciate other logic and circuits capable of enabling output buffers, and storing and combining test results. For example, instead of an AND gate, a chain of cascaded multiplexers can be used.

In one embodiment, the supporting logic (e.g., shift registers 342 and 346, latches 348, and AND gate 331) for the test can be implemented in dedicated hardware located on the IC as a built-in self test (BIST). In another embodiment, some or all of the supporting logic can be external to the IC, for instance as part of the test equipment. In yet another embodiment, the IC can be a PLD, and the supporting logic can be implemented in the PLD's programmable resources. Advantageously, implementing the supporting logic in programmable resources of a PLD means that no additional circuitry is needed, either on the IC under test or in the test equipment. The PLD merely needs to be appropriately configured, as will be easily understood by one of ordinary skill in the art.

Figure 4:
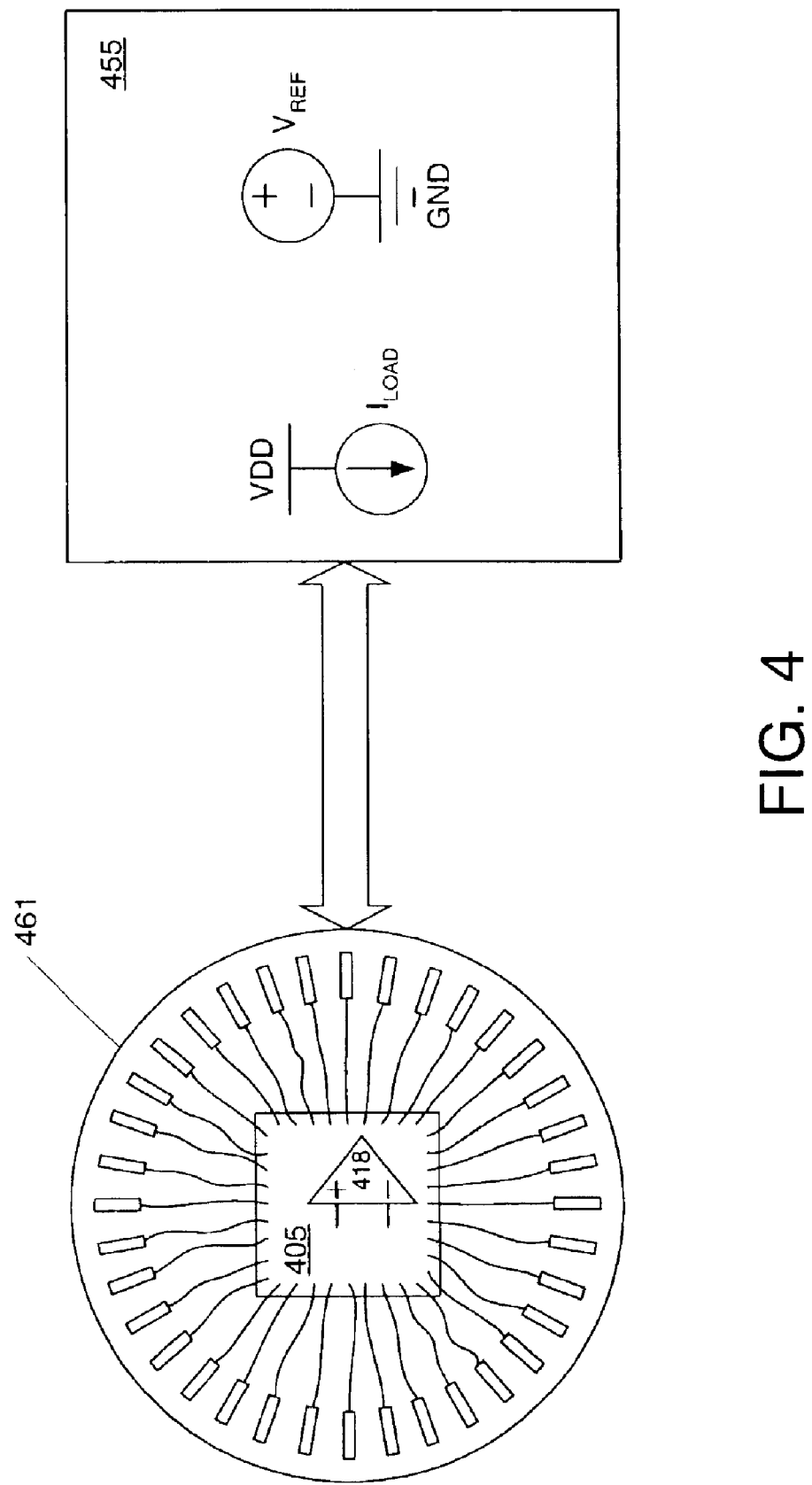
FIG. 4 shows a test configuration including a test interface and an ATE.

FIG. 4 shows an example of a typical test configuration in accordance with the present invention. An IC under test 405 includes at least one differential comparator 418. ATE 455 sends and receives test signals to and from IC 405 through a test interface 461. Test interface 461, for instance, can be a probe card used at wafer sort, or can be a test board used at final test. ATE 455 includes a current source for injecting a current $I_{LOAD}$ and a reference voltage source at a voltage level of $V_{REF}$. The current source and voltage source are coupled to IC 405 through test interface 461. IC 405 uses differential comparator 418 to measure output voltages and compare them to the reference voltage under the current load. The results of the test, from the output of differential comparator 418, are then sent back to ATE 455. Based on the test results (and the results of other tests) ATE 455 decides whether IC 405 is a good die.

It has been demonstrated that the present invention offers the advantages of precise output voltage measurement at low cost, or, in some embodiments, at no additional cost. Prior art test methods had an external voltage comparator, which led to inaccurate measurements due to parasitic effects. Those parasitic effects are eliminated by the present invention.

Those having ordinary skill in the relevant arts of the invention will now perceive various modifications and additions that can be made as a result of the disclosure herein. For example, the above text describes the circuits and methods of the invention in the context of ICs such as programmable logic devices. However, the circuits of the invention can also be implemented in other types of ICs. For another example, this specification describes methods for measuring $V_{OL}$, but the present invention can be easily adapted for measuring other voltage parameters, such as $V_{OH}$.

Furthermore, active-high signals can be replaced with active-low signals by making straightforward alterations to the circuitry, as is well known in the art of circuit design. Logical circuits can be replaced by their logical or functional equivalents, as is also well known.

Accordingly, all such modifications and additions are deemed to be within the scope of the invention, which is to be limited only by the appended claims and their equivalents.

What is claimed is:

1. A method for testing an integrated circuit comprising:
   applying a reference voltage to a first input of a differential comparator located on the integrated circuit;
   injecting a current at an I/O pad of the integrated circuit, wherein the I/O pad is coupled to a second input of the differential comparator;
   enabling an output buffer, wherein an output of the output buffer is coupled to the I/O pad; and
   comparing a voltage level of the first input of the differential comparator with a voltage level of the second input of the differential comparator.

2. The method of claim 1 wherein the voltage level of the first input of the differential comparator corresponds to an I/O standard of the integrated circuit.

3. The method of claim 1 further comprising:
   if the voltage level of the first input of the differential comparator is less than the voltage level of the second input of the differential comparator, discarding the integrated circuit.

4. The method of claim 1 further comprising:
   if the voltage level of the first input of the differential comparator is greater than the voltage level of the second input of the differential comparator, discarding the integrated circuit.

5. A test configuration for testing an integrated circuit comprising:
   a differential comparator located on the integrated circuit, having first and second inputs;
   a reference voltage source coupled to the first input of the differential comparator;
   a current source coupled to the second input of the differential comparator; and
   an output buffer of the integrated circuit coupled to the second input of the differential comparator.

6. The test configuration of claim 5 wherein the differential comparator provides a differential amplifier input of the integrated circuit.

7. The test configuration of claim 5 wherein the current source is located on the integrated circuit.

8. The test configuration of claim 5 further comprising:
   automated test equipment coupled to the integrated circuit.

9. The test configuration of claim 8 wherein the reference voltage source is a part of the automated test equipment.

10. The test configuration of claim 8 wherein the current source is a part of the automated test equipment.

11. The test configuration of claim 8 wherein the automated test equipment is coupled to the integrated circuit through a test interface.

12. The test configuration of claim 5 wherein the integrated circuit is a programmable logic device.

13. The test configuration of claim 5 further comprising:
   support logic for enabling the output buffer and for retrieving an output of the comparator.

14. The test configuration of claim 13 wherein the support logic comprises a shift register.

15. The test configuration of claim 14 wherein the shift register has two registers at each stage.

16. The test configuration of claim 13 wherein the support logic comprises an AND gate.

17. The test configuration of claim 16 wherein the AND gate is implemented as a chain of multiplexers.

18. The test configuration of claim 13 wherein the support logic is programmed in a programmable logic device.

19. A method for testing a programmable logic device comprising:

enabling a differential amplifier input of an I/O block of the programmable logic device;

enabling an output buffer of the I/O block, the output buffer having an output coupled to a first input of the differential amplifier input;

applying a reference voltage source to a second input of the differential amplifier input; and injecting a current at the first input of the differential amplifier input.

20. The method of claim 19 wherein the reference voltage source corresponds to an I/O standard of the programmable logic device.

21. The method of claim 19 wherein the differential amplifier input is an HSTL input.

* * * * *